United States Patent
Matsudo et al.

(10) Patent No.: US 8,651,049 B2
(45) Date of Patent: Feb. 18, 2014

(54) PLASMA PROCESSING APPARATUS

(71) Applicant: Tokyo Electron Limited, Tokyo (JP)

(72) Inventors: Tatsuo Matsudo, Nirasaki (JP); Shinji Himori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/684,416

(22) Filed: Nov. 23, 2012

(65) Prior Publication Data

US 2013/0075037 A1    Mar. 28, 2013

Related U.S. Application Data

(62) Division of application No. 12/407,922, filed on Mar. 20, 2009, now abandoned.

(60) Provisional application No. 61/092,626, filed on Aug. 28, 2008.

(30) Foreign Application Priority Data

Mar. 21, 2008 (JP) .................. 2008-073376

(51) Int. Cl.
  *C23C 16/00* (2006.01)
  *C23F 1/00* (2006.01)
  *H01L 21/306* (2006.01)

(52) U.S. Cl.
  USPC .................. 118/723 E; 156/345.43

(58) Field of Classification Search
  USPC .................. 118/723 E; 156/345.43
  See application file for complete search history.

(56) References Cited

U.S. PATENT DOCUMENTS

| | | |
|---|---|---|
| 2003/0029567 A1 | 2/2003 | Dhindsa et al. |
| 2003/0151371 A1 | 8/2003 | Fischer et al. |
| 2003/0180458 A1 | 9/2003 | Sneh |
| 2005/0276928 A1 | 12/2005 | Okumura et al. |
| 2006/0118044 A1 | 6/2006 | Himori et al. |
| 2007/0032081 A1* | 2/2007 | Chang et al. .................. 438/689 |

FOREIGN PATENT DOCUMENTS

| | | |
|---|---|---|
| DE | 10 2005 019 456 A1 | 11/2005 |
| DE | 602 21 535 T2 | 4/2008 |
| EP | 0 818 803 A2 | 1/1998 |
| JP | 2004-363552 A | 12/2004 |

(Continued)

OTHER PUBLICATIONS

Office Action issued Jan. 13, 2011, in Korean Patent Application No. 10-2009-0024130 with English translation.

(Continued)

*Primary Examiner* — Keath Chen
(74) *Attorney, Agent, or Firm* — Rothwell, Figg, Ernst & Manbeck, P.C.

(57) ABSTRACT

A plasma processing apparatus includes a processing gas supplying unit for supplying a desired processing gas to a processing space between an upper electrode and a lower electrode which are disposed facing each other in an evacuable processing chamber. The plasma processing apparatus further includes a radio frequency (RF) power supply unit for applying an RF power to one of the lower and the upper electrode to generate plasma of the processing gas by RF discharge and an electrically conductive RF ground member which covers a peripheral portion of the electrode to which the RF power is applied to receive RF power emitted outwardly in radial directions from the periphery portion of the electrode to which the RF power is applied and send the received RF power to a ground line.

12 Claims, 9 Drawing Sheets

(56) References Cited

FOREIGN PATENT DOCUMENTS

| | | |
|---|---|---|
| JP | 2005-277369 A | 10/2005 |
| JP | 2006-186323 A | 7/2006 |
| KR | 1989-0011046 A | 8/1989 |
| KR | 1995-0015623 A | 6/1995 |
| WO | 92/07377 A1 | 4/1992 |
| WO | 99/17336 A1 | 4/1999 |
| WO | 2005/055298 A1 | 6/2005 |

OTHER PUBLICATIONS

Office Action issued Jul. 5, 2011, in German Patent Application No. 10 2009 014 067.0 (with English-language translation).

* cited by examiner

PLASMA PROCESSING APPARATUS

CROSS-REFERENCE TO RELATED APPLICATIONS

This application is a division of and claims the benefit of priority from U.S. Ser. No. 12/407,922, filed Mar. 20, 2009, and the present application further claims the benefit of priority of U.S. Ser. No. 61/092,626, filed Aug. 28, 2008, and further the present application is based upon and claims the benefit of priority from the prior Japanese Patent Application No. 2008-073376, filed Mar. 21, 2008; the entire content of each of the foregoing is incorporated herein by reference.

FIELD OF THE INVENTION

The present invention relates to a technique for performing a plasma processing on a substrate to be processed, and more particularly, to a capacitively coupled plasma processing apparatus.

BACKGROUND OF THE INVENTION

In a manufacturing process of a semiconductor device or an FPD (flat panel display), a plasma is often used in the process, e.g., etching, deposition, oxidation, sputtering or the like, in order to allow a processing gas to react efficiently at a relatively low temperature. Conventionally, a capacitively coupled plasma processing apparatus is mainly used to easily realize a plasma having a large diameter for a single-wafer plasma processing apparatus.

In general, in a capacitively coupled plasma processing apparatus, an upper electrode and a lower electrode are disposed in parallel with each other in a vacuum processing chamber, and a target substrate (e.g., a semiconductor wafer, a glass substrate or the like) is mounted on the lower electrode, while a radio frequency (RF) power is applied between both electrodes. Then, electrons accelerated by an RF electric field formed between the electrodes, electrons emitted from the electrodes, or heated electrons collide with molecules of a processing gas to ionize them to thereby generate plasma of the processing gas, and accordingly, a desired microprocessing, e.g., etching, is performed on a substrate surface by radicals and ions in the plasma.

Here, the electrode to which the RF power is applied serves as a cathode (negative pole) that is connected to an RF power supply via a blocking capacitor in a matching unit. A cathode coupling type in which an RF power is applied to the lower electrode which mounts thereon a substrate and serves as a cathode can perform a well directed anisotropic etching by substantially vertically attracting ions in the plasma toward the substrate by using a self-bias voltage generated in the lower electrode.

Along with the recent trend for miniaturization of a design rule in manufacturing a semiconductor device or the like, an ever increasingly high dimensional accuracy is required especially in the plasma etching and, hence, selectivity against an etching mask and an underlying layer and/or in-plane uniformity in the etching has to be improved. Accordingly, there arises a demand for lowering ion energy as well as pressure in a processing region inside the chamber. For that reason, an RF power of about 40 MHz or greater has been applied, which is significantly higher than that applied in a conventional case.

Here, it becomes difficult to make a plasma of a uniform density in a processing space of the chamber (particularly in a radial direction). In other words, when the frequency of the RF power for plasma generation is increased, the plasma density becomes non-uniform by having a mountain-shaped profile in which the plasma density is maximized mostly above a central portion of a substrate and is minimized mostly above an edge portion of the substrate by a wavelength effect by which a standing wave is produced in the chamber and/or a skin effect by which the RF power is concentrated on a central portion of an electrode surface. If the plasma density is non-uniform above the substrate, a plasma process also becomes non-uniform, which leads to a reduced production yield of devices.

Various studies on electrode structures have been made to overcome such a problem. For example, Japanese Patent Laid-open Application No. 2004-363552 (Corresponding to U.S. Patent Application Publication No. 2005/0276928 A1) discloses a plasma processing apparatus in which a dielectric material is embedded at a main surface of an electrode facing a processing space and impedance of the RF power emitted from the electrode main surface to the processing space is made to be relatively large at a central portion of the electrode and relatively small at an edge portion of the electrode, thereby improving uniformity of a plasma density distribution.

At a certain frequency range, the method of embedding the dielectric material at the electrode main surface as described above can be employed to effectively transform, to a flat (uniform) profile, a mountain-like profile of the plasma density distribution on a subject substrate, which has its peak at the central portion of the substrate and becomes gradually getting low toward an edge portion of the substrate. However, if a frequency of the employed RF power is increased further, variation of the plasma density distribution (altitude difference in the mountain-like distribution) becomes larger in proportion to the increased frequency, thereby making it difficult to flattening the plasma density distribution. In addition, a cathode-coupled plasma processing apparatus is disadvantageous in that, if a frequency of the RF power exceeds about 80 MHz, a plasma density distribution produced by an RF power of a certain power level becomes to have a W-like profile in which the plasma density is high above the central portion and the edge portion of a substrate and low above the portion therebetween. Such a W-like profile cannot be dealt with the method of flattening the mountain-like profile.

SUMMARY OF THE INVENTION

In view of the above, the present invention provides a plasma processing apparatus capable of improving in-plane uniformity of a plasma process in wide RF frequency and power ranges.

In accordance with a first aspect of the invention, there is provided a plasma processing apparatus including: an evacuable processing chamber; a lower electrode for mounting thereon a substrate in the processing chamber; an upper electrode facing the lower electrode in parallel in the processing chamber; a processing gas supplying unit for supplying a processing gas to a processing space between the upper electrode and the lower electrode; a radio frequency (RF) power supply unit for applying an RF power to one of the lower and the upper electrode to generate a plasma of the processing gas by RF discharge; and an electrically conductive RF ground member which covers a periphery portion of the electrode to which the RF power is applied to receive RF power emitted outwardly in radial directions from the periphery portion of the electrode to which the RF power is applied and send the received RF power to a ground line.

The electrode to which the RF power is applied may be the lower electrode.

In this configuration, when the RF power from the RF power supply unit goes around into the electrode main surface (top surface) along a surface layer of the lower electrode, a part of the RF power is emitted out of the periphery portion of the top surface of the electrode. Since the RF ground member receives the part of the RF power and sends it to the ground line, the part of the RF power makes no contribution to discharge of the processing gas, i.e., plasma generation. Thus, a plasma generation region in the processing space is confined to a region right above or near the substrate to be processed and a profile of the plasma density distribution on the substrate can be stabilized.

In accordance with a second aspect of the invention, there is provided a plasma processing apparatus including: an evacuable processing chamber; a lower electrode for mounting thereon a substrate in the processing chamber; an upper electrode facing the lower electrode in parallel in the processing chamber; a processing gas supplying unit for supplying a processing gas to a processing space between the upper electrode and the lower electrode; a radio frequency (RF) power supply unit for applying an RF power to one of the lower and the upper electrode to generate a plasma of the processing gas by RF discharge; and a grounded electrically conductive RF ground member which covers a periphery portion of a top or a bottom surface and a side surface of the electrode to which the RF power is applied.

The electrode to which the RF power is applied may be the lower electrode.

In this configuration, when the RF power from the RF power supply unit goes around into the electrode main surface (top surface) along a surface layer of the lower electrode, a part of the RF power is emitted out of the periphery portion of the top surface and a side surface of the electrode. Since the RF ground member receives the part of the RF power and sends it to the ground line, the part of the RF power makes no contribution to discharge of the processing gas, i.e., plasma generation. Thus, a plasma generation region in the processing space is confined to a region right above or near the substrate to be processed and a profile of the plasma density distribution on the substrate can be stabilized. In addition, the RF ground member may preferably covers a substantially entire region of the top surface of the lower electrode projecting outwardly in radial directions from the substrate.

A dielectric material may be interposed between the lower electrode and the RF ground member. Further, a surface of the RF ground member is covered by an insulating film.

It is preferable that an annular gas exhaust path for connecting the processing space to a gas exhaust port provided at a bottom portion of the processing chamber may be formed between the RF ground member and an inner wall of the processing chamber, and a plurality of conductive fin members, which is electrically grounded and vertically extending, for promotion of extinction of a plasma diffused from the processing space is provided at an upper region of the gas exhaust path. This plasma extinction promotion function of the fin members may reduce plasma existing near or above the entrance of the gas exhaust path, thereby relatively increasing the plasma density of a region right above the wafer while reducing altitude differences in the plasma density distribution.

The plurality of fin members may be seamlessly molded as a single unit with or attached to an electrically conductive exhaust ring provided annularly at the upper region of the gas exhaust path and surfaces of the fin members are covered by insulating films. Further, the fin members are radially disposed at regular intervals in a circumferential direction of the gas exhaust path.

Further, by providing the RF ground member, a plasma density distribution on the substrate can have the mountain-like profile in a wide RF power range. In order to correct the profile to make it more flattened, it is preferable that a dielectric material having a thickness distribution in which the dielectric material is thickest in the central portion of the lower or the upper electrode and is thinnest in an edge portion of the lower or the upper electrode may be prepared at a top surface region of the lower electrode or a bottom surface region of the upper electrode.

The RF power may have a frequency equal to or higher than 80 MHz. With such configuration, it is possible to improve in-plane uniformity of a plasma density and a plasma process in wide RF power ranges. Further, another RF power is applied to the lower electrode to attract ions in the plasma mainly towards the substrate disposed on the lower electrode from another RF power supply unit.

In accordance with the plasma processing apparatus of the present invention with the above-described configuration and operation, it is possible to improve in-plane uniformity of a plasma process in wide RF frequency and power ranges.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
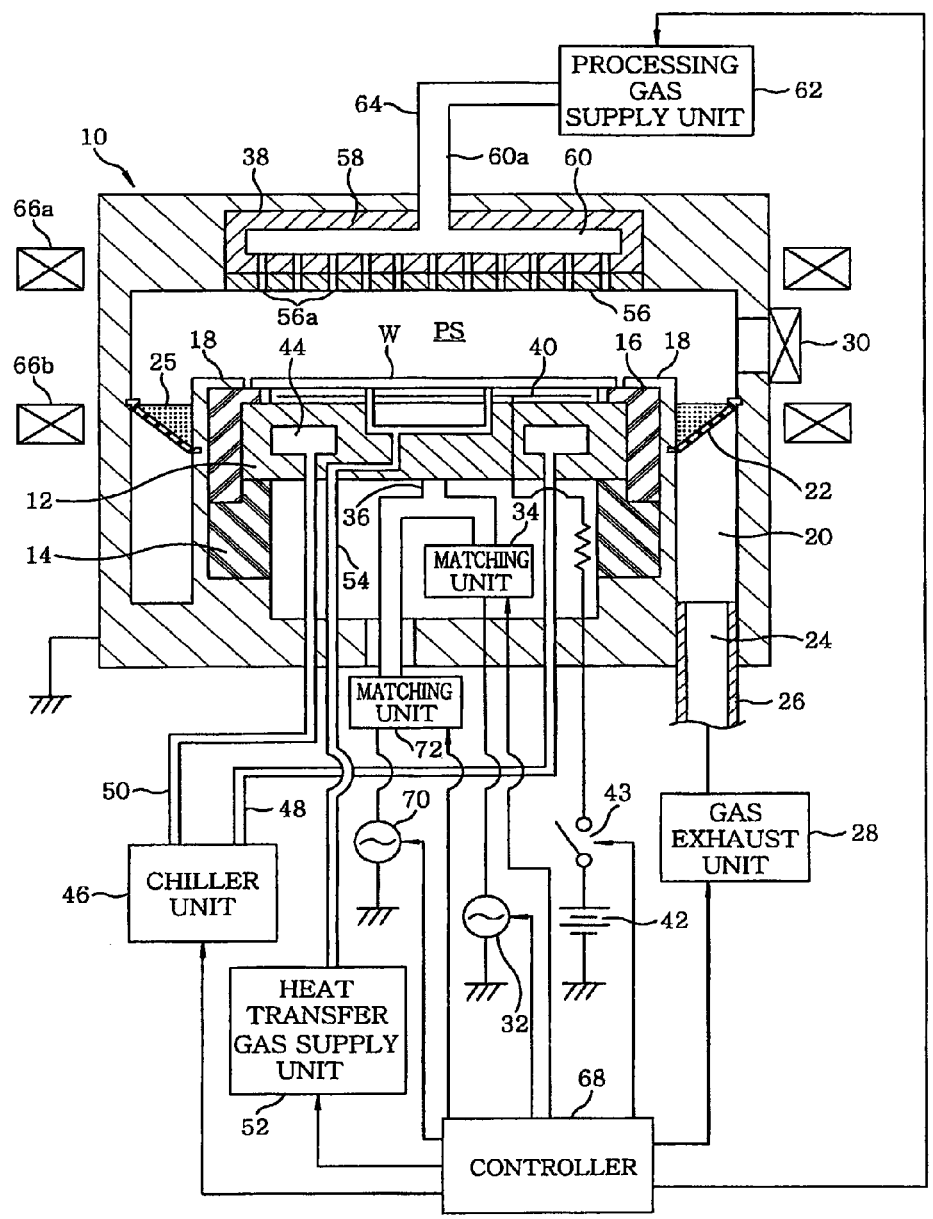
FIG. 1 is a vertical cross sectional view showing a configuration of a capacitively coupled plasma etching apparatus in accordance with an embodiment of the present invention.

Hereinafter, embodiments of the present invention will be described with reference to the accompanying drawings which form a part hereof FIG. 1 shows a configuration of a plasma etching apparatus in accordance with an embodiment of the present invention. The plasma processing apparatus is configured as a capacitively coupled plasma etching apparatus of a cathode coupling type (lower electrode dual frequency application type) in which dual radio frequency (RF) powers are applied to a lower electrode, and includes a cylindrical chamber (processing chamber) 10 made of metal such as aluminum, stainless steel or the like. The chamber 10 is frame grounded.

A circular plate-shaped lower electrode or a susceptor 12 for mounting thereon a substrate to be processed, e.g., a semiconductor wafer W, is installed in the chamber 10. The susceptor 12 is made of a conductive material, e.g., aluminum, and is supported by the bottom wall of the chamber 10 through a cylindrical support 14 made of an insulating material, e.g., alumina.

Figure 2:
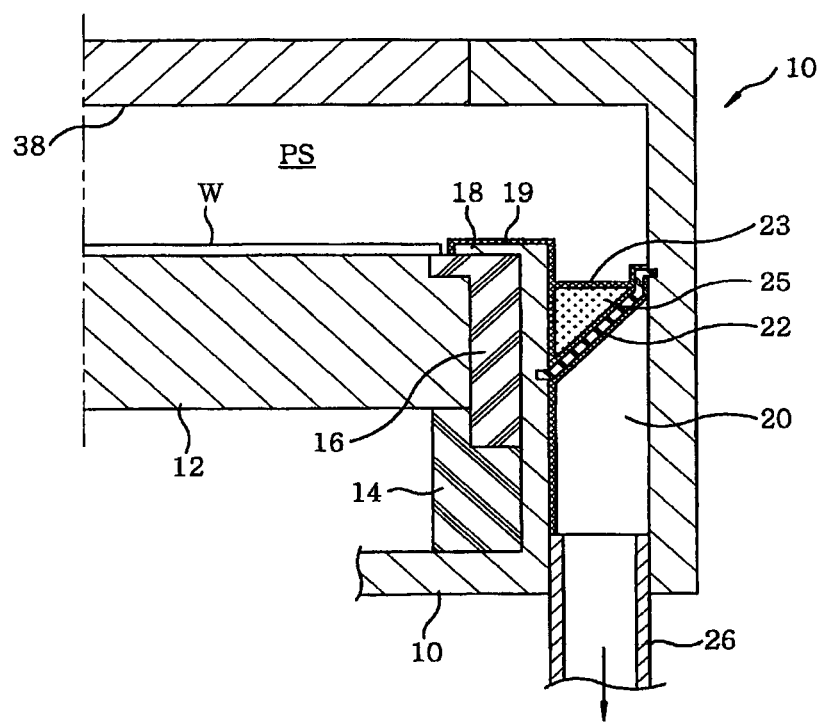
FIG. 2 is a partially-enlarged sectional view showing an enlarged configuration of a main part in the capacitively coupled plasma etching apparatus in accordance with the embodiment of the present invention.

An RF ground member 18 is vertically extended from a bottom wall of the chamber 10. The RF ground member 18 covers a side surface, preferably the entire side surface, and a periphery portion (edge portion) of a top surface (hereinafter, referred to as "top periphery portion") of the susceptor 12 with a dielectric material 16 interposed therebetween. The dielectric material 16 is made of e.g., quartz. A lower portion of the dielectric material 16 is connected to an upper portion of the cylindrical insulating support 14, while an upper portion thereof is bent approximately at a right angle toward the center of the susceptor 12 so as to cover the top periphery portion of the susceptor 12. The RF ground member 18 is made of aluminum whose surface is covered by an anodic oxide film or an insulating film 19 (see FIG. 2, illustration of the insulating film 19 will be omitted in other figures.) such as $Y_2O_3$ or the like. A lower portion of the RF ground member 18 is connected to the bottom wall of the chamber 10 and an upper portion of the RF ground member 18 is bent approximately at a right angle toward the center of the susceptor 12 so as to cover the top periphery portion of the susceptor 12 via the dielectric material 16.

A gas exhaust path 20 is annularly formed between the RF ground member 18 and the inner wall of the chamber 10. In addition, an exhaust ring (baffle plate) 22 of a conical shape is annularly attached near the entrance or at an upper portion of the gas exhaust path 20 and a gas exhaust port 24 is provided at a bottom portion of the gas exhaust path 20. Further, a gas exhaust unit 28 is connected to the gas exhaust port 24 via a gas exhaust pipe 26. The gas exhaust unit 28 has a vacuum pump so that a processing space in the chamber 10 can be depressurized to a desired vacuum level. Attached to an outer sidewall of the chamber 10 is a gate valve 30 for opening and closing a loading/unloading port for the semiconductor wafer W.

A first RF power supply 32 for RF discharge is electrically connected to the susceptor 12 via a first matching unit 34 and a power feed rod 36. The first RF power supply 32 applies a first RF power having a relatively high frequency appropriate for plasma generation, e.g., 100 MHz, to the lower electrode, i.e., the susceptor 12. A shower head 38 to be described later, serving as an upper electrode of a ground potential, is provided in a ceiling portion of the chamber 10. With this configuration, the first RF power from the first RF power supply 32 is capacitively applied between the susceptor 12 and the shower head 38.

Moreover, a second RF power supply 70 is electrically connected to the susceptor 12 via a second matching unit 72 and the power feed rod 36. The second RF power supply 70 outputs a second RF power having a relatively low frequency appropriate for ion attraction, e.g., 3.2 MHz.

An electrostatic chuck 40 for attracting and holding the semiconductor wafer W by an electrostatic attractive force is provided on the top surface of the susceptor 12. The electrostatic chuck 40 is formed by embedding an electrode made of a sheet or mesh-like conductive material in an insulating film. This electrode is electrically connected with a DC power supply 42 via a switch 43 and an electric wire. By a Coulomb force generated by a DC voltage from the DC power supply 42, the semiconductor wafer W can be attracted to be held by the electrostatic chuck 40.

Installed in the susceptor 12 is a coolant chamber 44 extended in, e.g., a circumferential direction. In the coolant chamber 44, a coolant of a predetermined temperature, e.g., cooling water, from a chiller unit 46 is circulated via lines 48 and 50. A process temperature of the semiconductor wafer W on the electrostatic chuck 40 can be controlled based on the temperature of the coolant. Further, a heat transfer gas, e.g., He gas, from a heat transfer gas supply unit 52 is supplied between the top surface of the electrostatic chuck 40 and the backside of the semiconductor wafer W via a gas supply line 54.

The shower head 38 on the ceiling portion includes an electrode plate 56 having a plurality of gas injection holes 56a in the bottom surface and an electrode support 58 for detachably supporting the electrode plate 56. A buffer chamber 60 is provided within the electrode support 58, and a gas supply line 64 extending from a processing gas supplying unit 62 is connected to a gas inlet port 60a of the buffer chamber 60.

Two ring magnets 66a and 66b annularly or concentrically extending are disposed around the chamber 10 and magnetic fields are generated at a peripheral region of a processing space PS between the susceptor 12 and the upper electrode 38. These ring magnets 66a and 66b are arranged to be rotated by a rotation mechanism (not shown).

A controller 68 is provided to control operation of each unit in the plasma etching apparatus such as the gas exhaust unit 28, the first RF power supply 32, the first matching unit 34, the switch 43 for, the electrostatic chuck, the chiller unit 46, the heat transfer gas supply unit 52, the processing gas supplying unit 62, the second RF power supply 70, the second matching unit 72 and the like. In addition, the controller 68 is connected to a host computer (not shown) and the like.

To carry out an etching process in the plasma etching apparatus, first, the gate valve 30 is opened. Next, the semiconductor wafer W to be processed is loaded into the chamber 10 to be mounted on the electrostatic chuck 40. Thereafter, an etching gas (generally a gaseous mixture) is introduced at a predetermined flow rate from the processing gas supplying unit 62 into the chamber 10 and the internal pressure of the chamber 10 is set to a preset value by the gas exhaust unit 28. Moreover, the first RF power is supplied with a predetermined power from the first RF power supply 32 to the susceptor 12 while the second RF power is supplied with a predetermined power from the second RF power supply 70 to the susceptor 12. Further, a DC voltage is applied from the DC power supply 42 to the electrode of the electrostatic chuck 40, thus attracting and holding the semiconductor wafer W on the electrostatic chuck 40. The etching gas injected through the shower head 38 is converted to a plasma between both electrodes 12 and 38 by the first RF discharge, and the main surface of the semiconductor wafer W is etched into a desired pattern by radicals or ions generated by the plasma.

In the plasma etching apparatus, by applying the first RF power having a radio frequency (preferably 80 MHz or higher) significantly higher than that applied in the conventional techniques from the first RF power supply 32 to the susceptor (lower electrode) 12, a high-density plasma in a desirable dissociated state can be generated even at a lower pressure. At the same time, by applying the second RF power having a relatively low frequency (e.g., 3.2 MHz) appropriate for ion attracting to the susceptor 12, an anisotropic etching with high selectivity for a film to be processed on a semiconductor wafer W can be performed. While the first RF power for plasma generation is always used in all plasma processes, the second RF power for ion attraction may or may not be used depending on a process.

The main feature of this capacitively coupled plasma etching apparatus lies in the configuration that the electrically conductive RF ground member 18 covers the side surface and the top periphery portion of the susceptor 12 via the dielectric material 16, as shown in an enlarged partial view in FIG. 2.

Now, operation and function of the RF ground member 18 will be described with reference to FIG. 3. The ion attraction by the second RF power has no particular relation to the operation of the RF ground member 18, and therefore, the second RF power supply 70 is not shown in FIG. 3.

Figure 3:
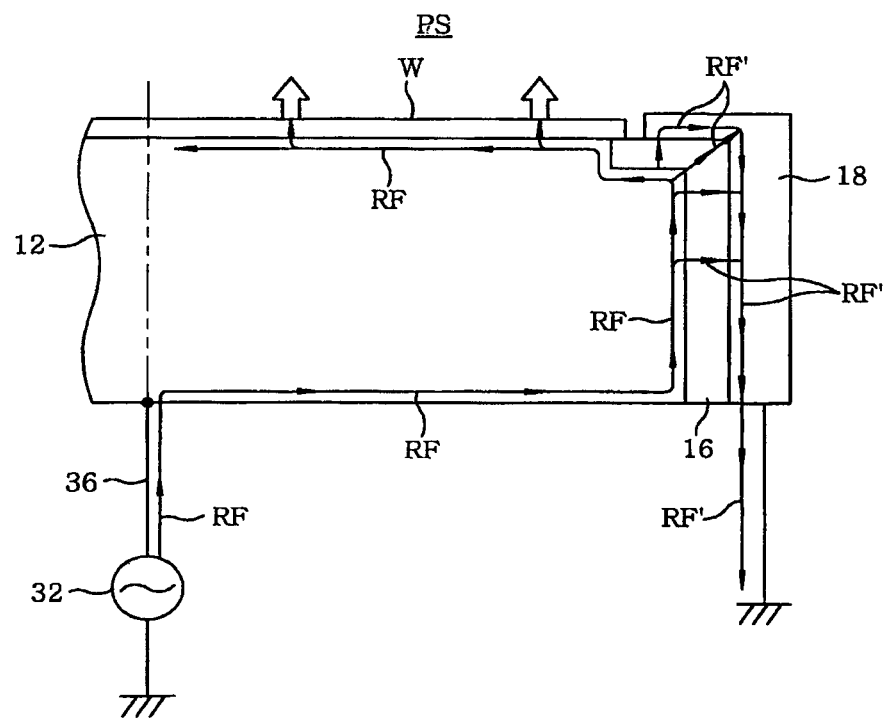
FIG. 3 is a view for explaining operation and function of an RF ground member in accordance with the embodiment of the present invention.

In FIG. 3, the first RF power outputted from the first RF power supply 32 is transmitted to the bottom center of the susceptor 12 through a surface layer of the circumferential surface of the power feed rod 36 to propagate outwardly in radial directions along a surface layer of the bottom surface of the susceptor therefrom, and reaches to the top surface of the susceptor by flowing through the outer circumferential surface (side surface) of the susceptor. At the top surface of the susceptor 12, the first RF power goes out of the semiconductor wafer W and is emitted into the processing space PS while propagating inwardly in the inverse radial directions from the top periphery portion to the central portion of the top surface (hereinafter, referred to as "top central portion") of the susceptor. The first RF power emitted into the processing space PS collides with molecules of the processing gas, thereby ionizing or dissociating the gas molecules. Here, if the frequency of the first RF power exceeds about 80 MHz, a percentage of the first RF power escaping through the outer circumferential surface (side surface) or the top periphery portion of the susceptor 12 before the first RF power reaches to a portion below the semiconductor wafer W, i.e., the top surface of the susceptor 12 is measurably increased.

In the present embodiment, the RF', the part of the first RF power escaping through the outer circumferential surface (side surface) or the top periphery portion of the susceptor 12, enters into the RF ground member 18 immediately after escaping from the dielectric material 16, propagates to the bottom wall of the chamber 10 along a surface layer of the inner side of the RF ground member 18, and then flows into a ground line therefrom.

Therefore, among the first RF power supplied to the susceptor 12, only the power emitted from the top surface of the susceptor 12 into the processing space PS through the semiconductor wafer W contributes effectively to the ionization or dissociation of the processing gas, i.e., the plasma generation, and a region for plasma generation in the processing space PS is ideally confined to a region right above the semiconductor wafer W. In other words, plasma generation in a region at an outer side in a radial direction other than the region right above the semiconductor wafer W in the processing space PS is extremely limited, and any influence from adjacent regions on the plasma density distribution of the region right above the wafer is suppressed. Accordingly, the plasma density distribution on the semiconductor wafer W mounted on the susceptor 12 can hardly have a W-like profile in which the plasma density distribution is increased at its edge portion as well as its central portion and is sunk at the portion therebetween.

Figure 4:
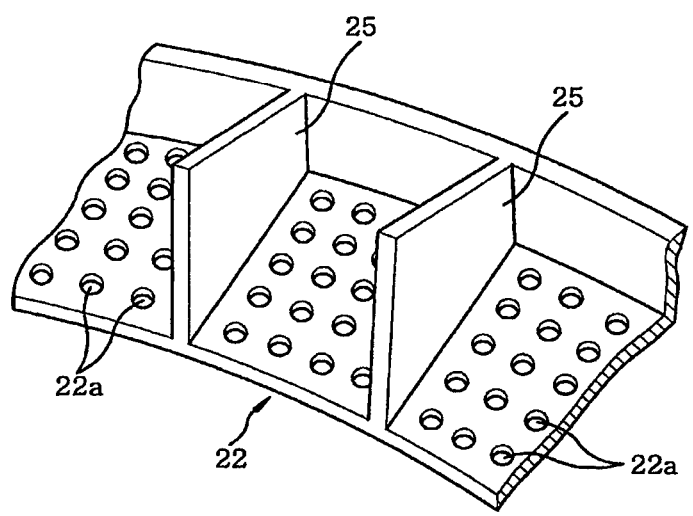
FIG. 4 is a perspective view showing an example of a configuration of a fin member in accordance with the embodiment of the present invention.

Further, another feature of the capacitively coupled plasma etching apparatus to improve a plasma density distribution characteristic is a plurality of plate-like fin members 25 each having vertical flat surfaces. The fin members 25 are seamlessly molded as a single unit with or attached to the baffle plate 22 disposed near the entrance of the gas exhaust path 20. As shown in FIG. 4, the fin members 25 are radially disposed at regular intervals in the circumferential direction of the baffle plate 22. Moreover, vent holes 22a are formed in the bottom wall of the baffle plate 22. Each of the fin members 25 and the baffle plate 22 is made of an electrically conductive material, e.g., aluminum whose surface is covered by an anodic oxide film or an insulating film 23 (see FIG. 2, illustration of the insulating film 23 in other figures is omitted) such as $Y_2O_3$ and is electrically grounded via the chamber 10 or the RF ground member 18.

The fin members 25 have no effect on inherent functions (vacuum exhaust stabilization function and processing space pressure control function) of the baffle plate 22 and have a function to promote extinction of plasma being diffused from the processing space PS to the gas exhaust path 20. This plasma extinction promotion function of the fin members 25 may reduce the amount of the plasma existing near or above the entrance of the gas exhaust path 20, thereby relatively increasing the plasma density of a region right above the wafer while reducing altitude differences in a mountain-like profile.

Figure 6A:
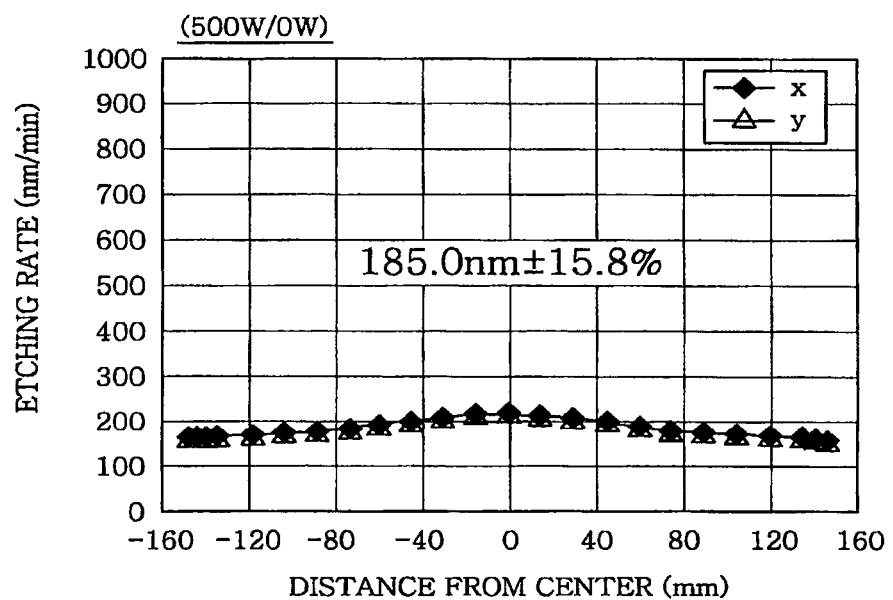
FIGS. 6A to 6C show an example of an etching rate distribution characteristic obtained from the configuration of the apparatus in accordance with the embodiment of the present invention.
Figure 6B:
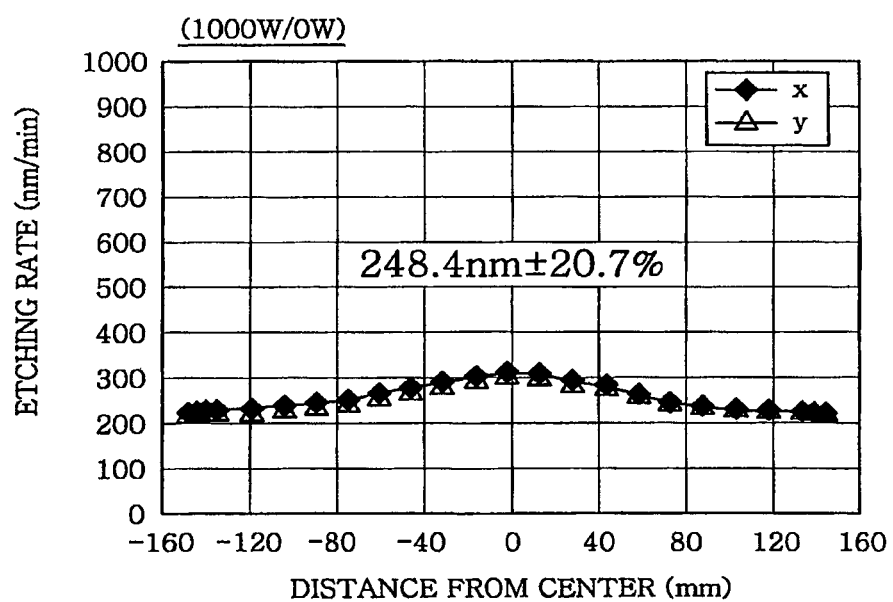
Figure 6C:
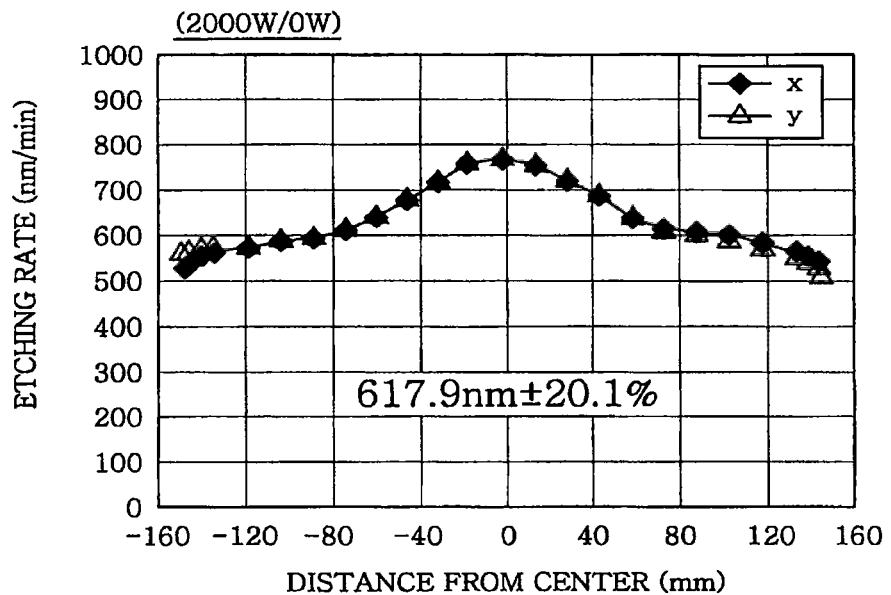

FIGS. 6A to 6C show an example of an in-plane distribution characteristic of an etching rate obtained in the etching process using the plasma etching apparatus shown in FIG. 1 in accordance with the embodiment. The main etching conditions are as follows:

Wafer diameter: 300 mm
Film to be etched: photoresist (blanket film)
Processing gas: $O_2$ 100 sccm
Internal pressure of chamber: 5 mTorr
RF power: 100 MHz/3.2 MHz=500 to 2000/0 W
Temperature: upper electrode/sidewall of chamber/lower electrode=60/60/20° C.
Heat transfer gas (He gas) supply pressure: central portion/edge portion=10/50 Torr FIGS. 7A to 7C show a comparative example of an in-plane distribution characteristic of an etching rate under the same etching conditions as the above for a configuration having neither RF ground member 18 nor fin members 25 in the plasma etching apparatus shown in FIG. 1, that is, the configuration of surrounding of the susceptor 12, as shown in FIG. 5.

Figure 5:
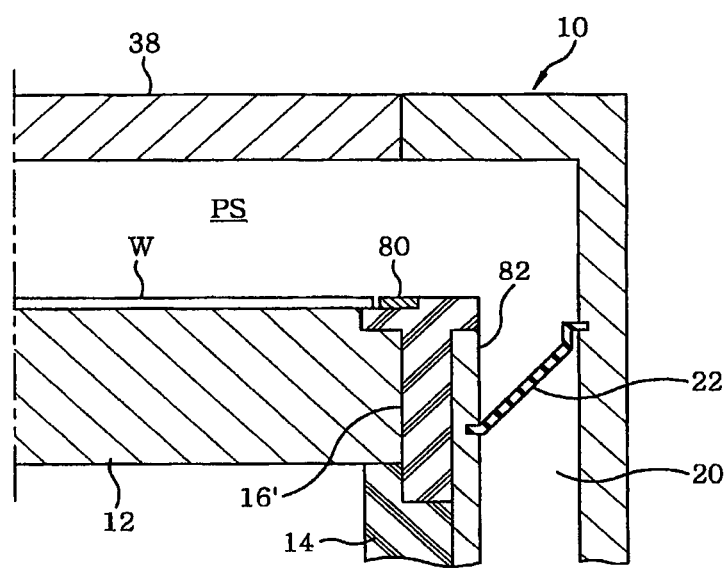
FIG. 5 is a partially-enlarged sectional view of a comparative example showing a main part of a configuration with no RF ground member and no fin member in the plasma etching apparatus shown in FIG. 1.

In FIG. 5, a dielectric material 16' covers the top periphery portion of the susceptor 12 and is exposed to oppositely face the upper electrode 38, the ceiling or inner wall of the chamber 10. A focus ring 80 made of, e.g., Si, SiC or the like is mounted on the dielectric material 16' so as to surround a wafer mount region on the top surface of the susceptor 12. A grounded cylindrical conductor 82 covering a side surface of the dielectric material 16' forms a wall of the gas exhaust path 20, but does not cover the top of the susceptor 12 and the dielectric material 16'.

Figure 7A:
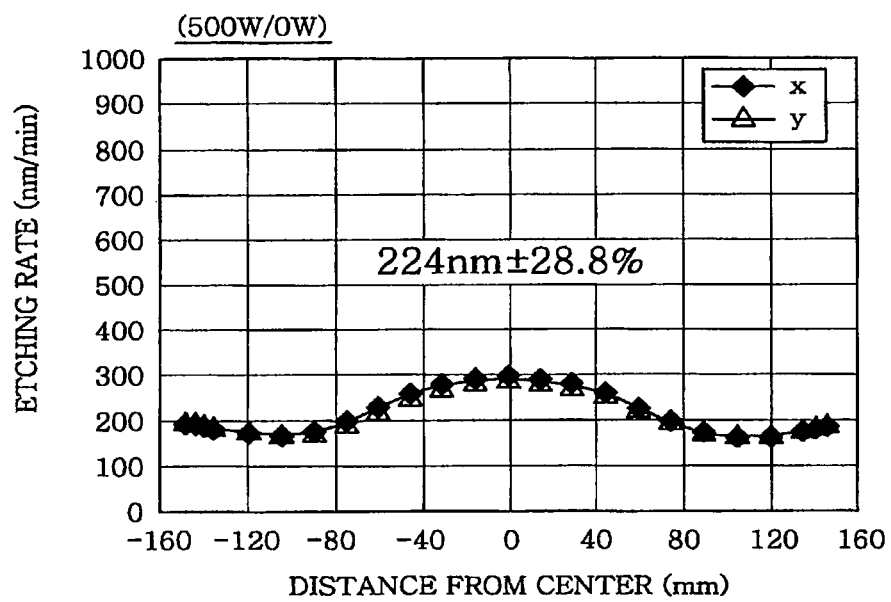
FIGS. 7A to 7C show an etching rate distribution characteristic of a comparative example obtained from the configuration of the apparatus shown in FIG. 5.
Figure 7B:
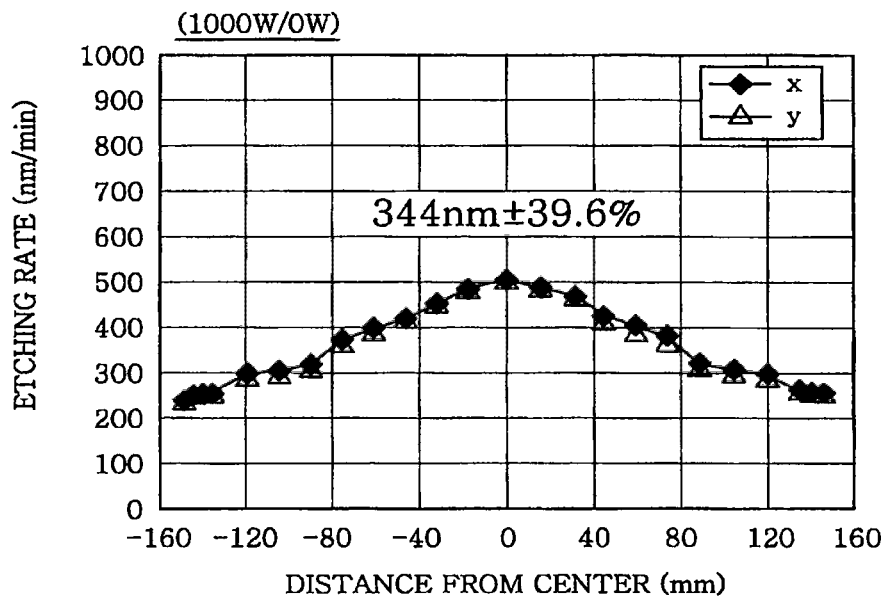
Figure 7C:
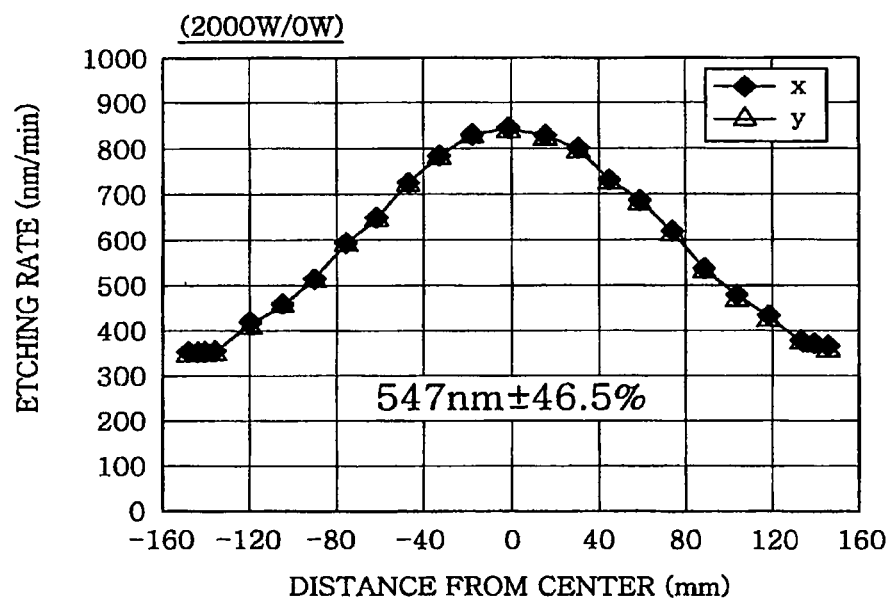

When the RF ground member 18 and the fin members 25 are not provided, as shown in FIGS. 7A to 7C, in-plane uniformity of an etching rate is significantly deteriorated from ±28.8% to ±39.6% and ±46.5% respectively as the first RF (100 MHz) power for plasma generation is increased from 500 W to 1000 W and 2000 W. On the other hand, an etching rate distribution for a low power level of 500 W is increased in an edge portion as well as a central portion on the substrate so that the etching rate distribution in a middle portion between the edge and central portion is sunk. Therefore, a W-like profile is produced.

On the contrary, in the present embodiment, as shown in FIGS. 6A to 6C, even when the first RF (100 MHz) power is increased from 500 W to 1000 W and 2000 W, the in-plane uniformity of the etching rate is stable with no significant change, changing from ±15.8% to ±20.7% and ±20.1%, respectively. Further, a mountain-like profile is constantly produced in any power level even though each has a different altitude, and a W-like profile is not produced.

Since an etching rate of a photoresist generally depends on electron density, the etching rate distribution characteristics shown in FIGS. 6A to 6C and FIGS. 7A to 7C may be evaluated by substituting them with electron density distribution characteristics.

As described above, in accordance with the present invention, even when the RF power for plasma generation has a substantially high frequency (80 MHz or above), it is possible to stabilize the in-plane uniformity of the electron density distribution in a wide RF power range while preventing an irregular change of an electron density distribution profile (particularly generation of a W-like electron density distribution profile). Accordingly, the in-plane uniformity of the plasma etching can be improved.

Figure 8:
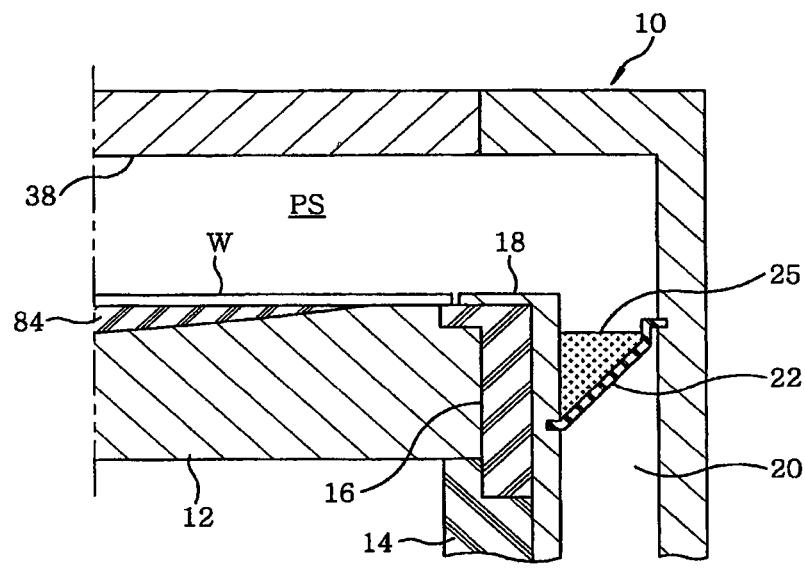
FIG. 8 is a partially-enlarged sectional view showing a configuration of a main part of a modification of the plasma etching apparatus in accordance with the embodiment of the present invention.

Further, since the electron density distribution has the mountain-like profile in any RF power level in the plasma etching apparatus of the above-described embodiment, a configuration in which a dielectric material 84 is embedded at the top surface of the susceptor 13 as shown in FIG. 8 may be preferably used to flatten the mountain-like profile. In this case, the dielectric material 84 may be prepared such that it has the largest thickness at the center of the susceptor 12 and is gradually getting thinner from the center (or from a point off the center) toward an edge portion of the susceptor 12.

Figure 9:
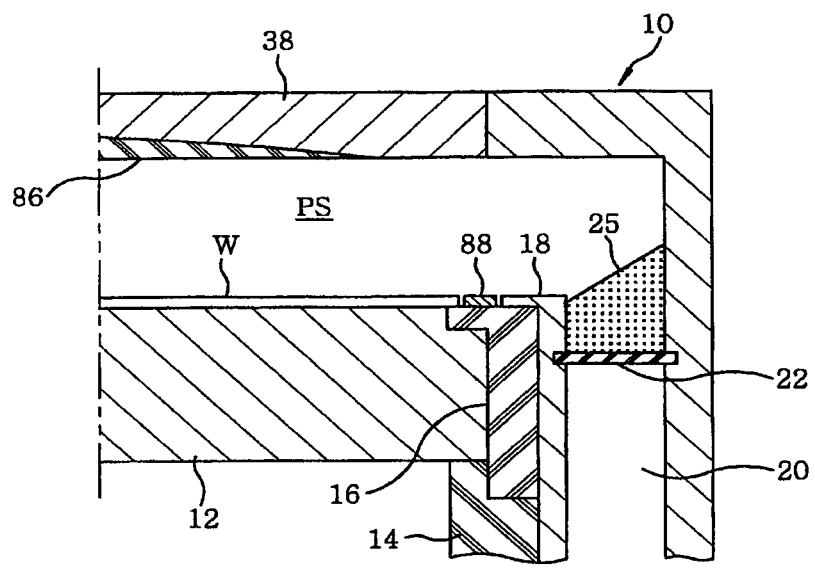
FIG. 9 is a partially-enlarged sectional view showing a configuration of a main part of another modification of the plasma etching apparatus in accordance with the embodiment of the present invention.

To the same purpose, a dielectric material 86 may be embedded at the bottom of the upper electrode 38 as shown in FIG. 9. In this case, similarly, the dielectric material 86 may be prepared such that it has the largest thickness at the center of the susceptor 12 and is gradually getting thinner from the center (or from a point off the center) toward an edge portion of the susceptor 12.

Although the embodiment of the present invention has been illustrated in the above, the present invention is not limited to the above embodiment, and may be variously modified. Particularly, various selections and modifications for the RF ground member 18 and the fin members 25 may be made such that they are optimally combined with other mechanisms in the apparatus.

For example, as shown in FIG. 9, an appropriate gap may be prepared between an edge portion of the semiconductor wafer W and the RF ground member 18 on the top surface of the susceptor 12 and a cover 88 made of an appropriate material (e.g., Si, SiC or the like) is provided in the gap in an electrically floating state. In this case, the RF power is emitted from the top surface of the susceptor 12 into the processing space PS through the dielectric material 16 and the cover 88, and plasma is also generated in a region above the cover 88. Further, the baffle plate 22 may be configured to have other shape than the conical shape, e.g., a flat annular shape having a main surface horizontally oriented, and the upper surfaces of the fin members 25 may be configured to be tilted as shown in FIG. 9. Further, although not shown, the fin members 25 may be configured to be separated from the baffle plate 22.

Figure 10:
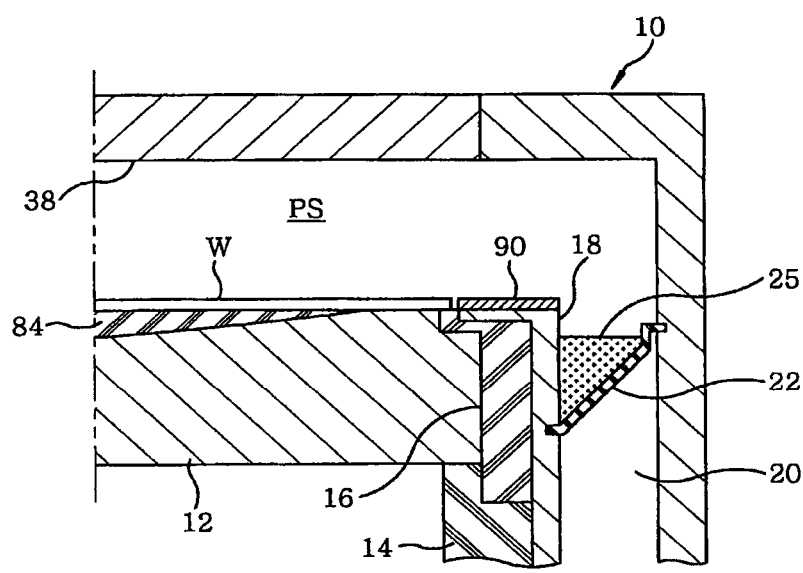
FIG. 10 is a partially-enlarged sectional view showing a configuration of a main part of still another modification of the plasma etching apparatus in accordance with the embodiment of the present invention.

Further, as shown in FIG. 10, the upper surface of the RF ground member 18 may be covered by a cover 90.

Moreover, the present invention is not limited to lower electrode dual frequency application type as in the above embodiment but may be, e.g., applied to a lower electrode single frequency application type in which a single RF power is applied to the susceptor (lower electrode) or a type in which an RF power for plasma generation is applied to the upper electrode.

Further, although not shown, in an apparatus in which the RF power for plasma generation is applied to the upper electrode, an RF ground member having the same configuration and function as the RF ground member 18 described in the above embodiment may be provided in the peripheral region of the upper electrode. By providing the RF ground member covering a side surface and a periphery portion of a bottom surface of the upper electrode, even when a part of the RF power applied to the upper electrode is emitted or leaked outwardly in radial directions at the side surface and the periphery portion of the bottom surface of the upper electrode, the RF ground member can receive the leaked RF power and send it to the ground line such that a plasma generation region in the processing space can be confined to a region right above and near a substrate to be processed.

The present invention is not limited to a plasma etching apparatus but may be applied to other plasma processing apparatuses for performing plasma CVD, plasma oxidation, plasma nitridation, sputtering and the like. Furthermore, the substrate to be processed in the present invention is not limited to the semiconductor wafer but may be various substrates for flat panel displays, photo masks, CD substrates, printed substrates and so forth.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
   an evacuable processing chamber having a processing space, a gas exhaust port provided at a bottom portion of the processing chamber, and an inner wall;
   a lower electrode for mounting thereon a substrate in the processing chamber;
   an upper electrode facing and parallel to the lower electrode in the processing chamber;
   a processing gas supplying unit for supplying a processing gas to the processing space, which is between the upper electrode and the lower electrode;
   a radio frequency (RF) power supply unit for applying an RF power to the lower electrode to generate a plasma of the processing gas by RF discharge;
   an electrically conductive RF ground member which covers a peripheral portion of the lower electrode to receive RF power emitted outwardly in radial directions from the peripheral portion of the lower electrode and to send the received RF power to a ground line;
   an annular gas exhaust path that connects the processing space to the gas exhaust port and that is provided between the RF ground member and an inner wall of the processing chamber; and
   a plurality of conductive fin members which are electrically grounded, which extend vertically, which are configured to promote extinction of a plasma diffused from the processing space, and which are provided at an upper region of the gas exhaust path.

2. The plasma processing apparatus of claim 1, further including a dielectric material interposed between the lower electrode and the RF ground member.

3. The plasma processing apparatus of claim 2, further comprising a cover in an electrically floating state through which the RF power emitted from the lower electrode passes, the cover covering at least a portion of a top surface of the dielectric material or at least a portion of a top surface the RF ground member.

4. The plasma processing apparatus of claim 1, wherein a surface of the RF ground member is covered by an insulating film.

5. The plasma processing apparatus of claim 1, wherein the plurality of fin members is seamlessly molded as a single unit with or attached to an electrically conductive exhaust ring provided annularly at the upper region of the gas exhaust path.

6. The plasma processing apparatus of claim 5, wherein surfaces of the fin members are covered by at least one insulating film.

7. The plasma processing apparatus of claim 1, wherein the fin members are radially disposed at regular intervals in a circumferential direction of the gas exhaust path.

8. The plasma processing apparatus of claim 1, wherein the RF power has a frequency equal to or higher than 80 MHz.

9. The plasma processing apparatus of claim 1, further comprising a dielectric portion having a thickness distribution in which the dielectric portion is thickest in a central portion of the lower or the upper electrode and is thinnest in an edge portion of the lower or the upper electrode wherein the dielectric portion is provided at a top surface region of the lower electrode or at a bottom surface region of the upper electrode.

10. The plasma processing apparatus of claim 1, further comprising a baffle plate disposed in the annular gas exhaust path, and wherein the plurality of conductive fin members extend vertically upwardly from the baffle plate.

11. The plasma processing apparatus according to claim 10, wherein the conductive fin members include a portion extending to a location higher than a substrate support surface of the lower electrode.

12. The plasma processing apparatus according to claim 1, wherein the conductive fin members include a portion extending to a location higher than a substrate support surface of the lower electrode.

* * * * *